Feb. 11, 1969 A. E. WOLFRAM 3,427,544
ULTRAHIGH FREQUENCY OSCILLATOR FOR A TELEVISION TUNER
Filed March 30, 1964
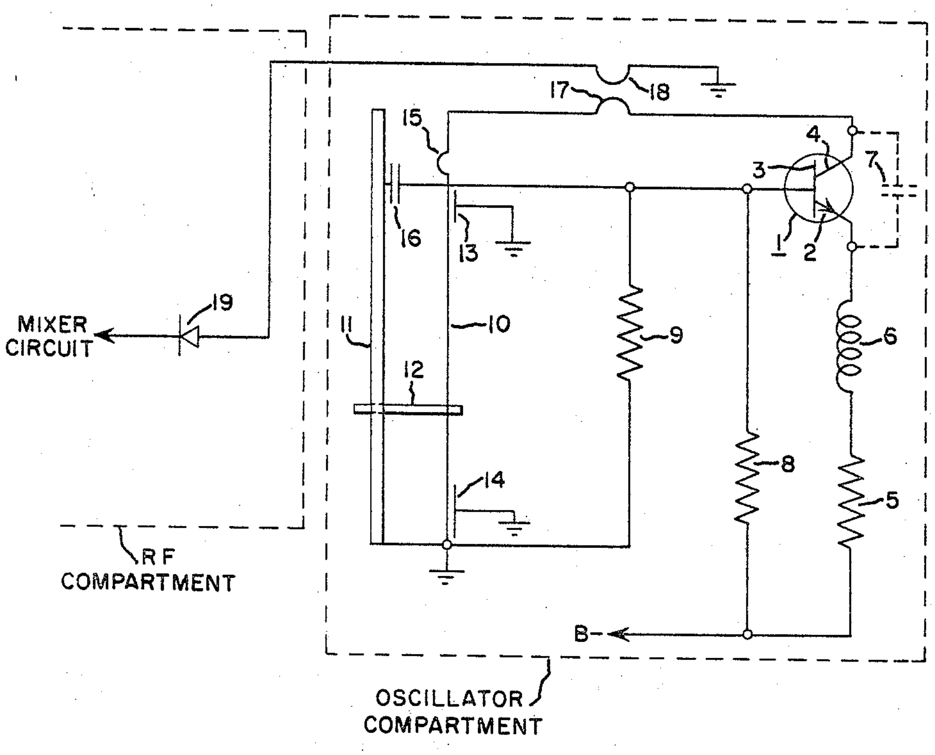
INVENTOR:
ADOLF E. WOLFRAM,
BY Donald N. Timbie
HIS ATTORNEY.

United States Patent Office 3,427,544
Patented Feb. 11, 1969

3,427,544

ULTRAHIGH FREQUENCY OSCILLATOR FOR A TELEVISION TUNER

Adolf E. Wolfram, Jamesville, N.Y., assignors to General Electric Company, a corporation of New York Filed Mar. 30, 1964, Ser. No. 355,670
U.S. Cl. 325—453 10 Claims
Int. Cl. H04b *1/16*

ABSTRACT OF THE DISCLOSURE

In a television tuner, an ultrahigh frequency transistor oscillator comprises a resonant transmission line including a single conducting line in parallel with and inductively coupled to a conductive shield plate which serves to separate various electronic components of a television receiver. A shorting bar intersects the single transmission line and the conductive shield plate and along with adjustable conductive tab members provides a tuning means for the resonant transmission line. The base electrode of the transistor oscillator is connected to a point on the conductive shield to provide a source of positive feedback from the phase shifted signal appearing across the conductive shield plate.

My invention relates to a transistorized ultrahigh frequency oscillator, and, more particularly, to a transistorized, inductively tuned ultrahigh frequency oscillator for utilization in a television tuner.

The production of an ultrahigh frequency oscillator tunable over a wide range of frequencies is made difficult because of the numerous device parameters. In a vacuum tube the inductance of the pins and leads and the input and output capacitances necessitate the use of a pair of transmission lines as a balanced tank circuit to provide an inductively tuned UHF oscillator. Such a balanced configuration makes it difficult to arrange a simple coupling network for a load, but the balanced lines are necessary because of the large lead-in inductances of vacuum tubes. Thus, the possibility of using transistors with their smaller lead-in inductances is raised.

Transistors have been previously utilized in television tuners to reduce spurious oscillations, permit miniaturization and reduce cost, but the disadvantages of the balanced tank circuit have not been conquered. For example, in a vary high frequency television tuner it is necessary to have an ultrahigh frequency oscillator to provide a local signal for use in the mixer circuit. Since lumped parameter circuits are not feasible at the UHF frequencies, it has generally been the practice in inductively tuned circuits to utilize a pair of transmission lines to form the oscillator circuit. The resonant tank circuit occurring in these oscillators is trimmed by capacitors utilized to track, or locate with respect to ground, the ends of the resonant transmission line. To tune such an oscillator it is necessary to simultaneously adjust the two transmission lines. As a result of my invention, only one transmission line is required in the UHF oscillator, trimming is achieved without the use of expensive capacitors and the oscillatory signal may be fed into the mixer by utilizing inductive coupling to the oscillator tank circuit.

Therefore, it is an object of my invention to produce an improved UHF inductively tuned, transistor oscillator tunable over a wide range of frequencies, for use in a television tuner.

Another object of my invention is to provide an ultrahigh frequency inductively tuned transistor oscillator which does not require a pair of transmission lines in the oscillator tank circuit.

Yet another object of my invention is to provide for trimming the resonant tank circuit wihtout utilizing relatively expensive capacitors.

Yet another object of my invention is to provide a simple coupling network for coupling the oscillator signal to the mixer circuit.

Other objects and advantages of my invention will become apparent as the following description proceeds and the features of novelty which characterize my invention will be pointed out with particularity in the claims annexed to and forming part of this specification.

For a better understanding of my invention, reference may be made to the accompanying drawing, the single figure of which is a circuit diagram of one embodiment of my invention.

In carrying out the objects of my invention, in one form thereof, a transistor oscillator replaces the conventional vacuum tube oscillator which is utilized to provide an ultrahigh frequency signal to the mixer circuit. The UHF transistor oscillator is in the form of a Hartley oscillator circuit with a single resonant transmission line providing the tank circuit. Formation of the transmission line is achieved by placing a conducting line parallel to a conducting plate or partition which separates the oscillator compartment from the RF compartment. Besides providing one element of the resonant transmission line, the plate acts as an inductive feedback element to couple a positive feedback signal to the base of the transistor oscillator.

The positive feedback signal is the result of phase-shifting the output of the transistor so that the feedback is out of phase with the transistor oscillator signal. Additional positive feedback is obtained from an inductance located in the emitter circuit of the transistor. This inductance induces a positive feedback in the emitter circuit through the collector-emitter capacitance of the transistor.

Trimming of the transmission line tank circuit is achieved by adjustable metallic tabs placed at either end of the conducting line. The tab at the grounded end of the conducting line is quite large compared to the tab at the other end of the line, thereby exhibiting an inductive effect, while the tab at the other end provides a capacitive effect. These metallic tabs act to track the ends of the resonant transmission line.

Referring now to the drawing it may be seen that this embodiment of the oscillator circuit includes a transistor 1. Transistor 1 has an emitter 2, a base 3, and a collector 4. A negative supply voltage from the power source is applied to emitter 2 through resistor 5 and coil 6. Resistor 5 acts as a normal dropping resistor and coil 6 is an RF choke to prevent high frequencies from being applied to the emitter of the transistor.

The coil 6 also acts to provide an additional feedback signal for the oscillator. The large oscillator voltage appearing across the inductance 6 induces an out-of-phase, or positive feedback, component in the emitter circuit. Collector-emitter capacitance 7 of the transistor 1 serves to introduce the signal into the emitter circuit.

A base bias is obtained from the same power source that supplies the emitter. Resistors 8 and 9 determine the magnitude of the bias that is applied to the base 3.

Collector 4 of transistor 1 is connected to the conducting line 10. Conducting line 10 is a length of conducting wire which exhibits inherent inductive characteristics at the ultrahigh frequencies found in this oscillator.

Plate 11 is a partition which separation the oscillator compartment and the RF compartment. It is composed of a high-conductivity material such as copper or silver-plate on a suitable base. Due to its high conductivity characteristics, the plate acts as a shield to prevent RF signals from being introduced into the oscillator circuit.

Conducting line 10 and plate 11 are located parallel to each other. The parallel combination of conducting line 10 and plate 11 forms, in effect, a parallel-line, resonant transmission line. This resultant transmission line provides a tank circuit for the oscillator. The resonant frequency of the tank circuit may be adjusted by the slider 12, which is schematically represented in the drawing. Slider 12 is formed of a highly conductive material and acts as a shorting bar to ground conducting line 10 at the desired point of resonance.

Metallic tabs 13 and 14 also aid in tuning the tank circuit. Tab 13 is relatively small and acts as a capacitance in the circuit. Tab 14 is made considerably larger than tab 13 and, therefore, acts as an inductive element in the circuit. By proper utilization of the slider 12 and the tabs 13 and 14 the tank circuit may be set for any desired frequency in the UHF range.

A variable inductance loop 15 is connected to the nongrounded end of conducting line 10. Inductive loop 15 serves to adjust the upper limit of the frequency range of the tank circuit.

Besides being the partition between the RF and oscillator compartments and one element of the tank circuit, plate 11 has a third function. Plate 11 additionally acts as a feedback element by inductively coupling to the conducting line to apply a positive feedback signal to the base of transistor 1. The positive feedback signal is applied to the base through capacitor 16. Capacitor 16, besides providing an impedance element for injecting the feedback signal to the base, acts as a blocking capacitor to prevent the DC bias on the base from being applied to the plate 11.

To transfer the oscillator signal to the mixer circuit, a coupling loop 17 is connected between the inductive loop 15 and the collector 4 of transistor 1 and is electrically coupled to a similar coupling loop 18 in the mixer circuit. The coupling loop 18 is connected to the mixer circuit through diode 19. Capacitive coupling could also be used to supply the oscillator signal to the mixer.

In operation, the transistor 1 is biased in such a manner that any natural unbalance in the circuit will cause oscillations to be produced. These oscillations occur as a result of positive feedback and have a frequency dependent upon the setting of the tank circuit.

Proper positioning of slider 12 and metallic tabs 13 and 14 cause the tank circuit formed by conducting line 10 and plate 11 to resonate at the desired frequency. If the slider 12 is placed at its extreme position on the high frequency end of the tank circuit, only the inductive loop 15 remains in parallel with the plate 11. Thus, the highest frequency obtainable with the tank circuit is controlled by the inductive loop 15.

Oscillations produced in the tank circuit must be fed back to the base of the transistor. This function is also achieved by plate 11. Since the plate acts as an inductive element at these ultrahigh frequencies, it inductively couples the signal from the tank circuit to the base of the transistor. The feedback signal is injected into the base lead through capacitor 16, which also blocks the base bias from being applied to plate 11.

Coupling of the oscillator signal to the mixer circuit is achieved by means of coupling loops 17 and 18. As a result of the RF ground provided by plate 11, this coupling is achieved without any need for balancing the tank circuit. The oscillator signal is then fed to the mixer circuit through diode 19.

What I claim as new and desire to secure by Letters Patent of the United States is:

1. A television tuner comprising: an RF compartment including a mixer circuit; an oscillator compartment including an ultrahigh frequency oscillator; a plate of conducting material dividing said compartments; said ultrahigh frequency oscillator comprising a transistor having an emitter, a collector, and a base; a conducting line connected between the collector of said transistor and ground; said plate of conducting material being connected between the base of said transistor and ground, said plate and said conducting line together forming a resonant transmission line; means for varying the effective length of said transmission line to form an adjustable frequency tank circuit, said plate being inductively coupled to said conducting line to apply a positive feedback signal to the base of said transistor.

2. A television tuner as recited in claim 1 and further including: an inductive coil in series with the emitter of said transistor, said coil providing a positive feedback signal for the emitter circuit of said transistor through the collector-emitter capacitance of said transistor.

3. A television tuner comprising: an RF compartment including a mixer circuit; an oscillator compartment including an ultrahigh frequency oscillator; a plate of conducting material dividing said compartments; said ultrahigh frequency oscillator comprising a transistor having an emitter, a collector, and a base; a conducting line connected between the collector of said transistor and ground; said plate of conducting material being connected between the base of said transistor and ground, said plate and said conducting line together forming a resonant transmission line; a conductive shorting bar connected between said plate and said conducting line to vary the effective length of said transmission line to form an adjustable frequency tank circuit; said plate being inductively coupled to said conducting line to apply a positive feedback signal to the base of said transistor.

4. A television tuner as recited in claim 3 and further including: a first metallic tab electrically coupled to the grounded end of said conducting line; a second metallic tab electrically coupled to the nongrounded end of said conducting line, said tabs providing a trimming means for said tank circuit.

5. A television tuner as recited in claim 4 wherein said first metallic tab is relatively large compared to said second metallic tab, whereby said first metallic tab exhibits an inductive effect and said second metallic tab exhibits a capacitive effect, both of these effects being utilized to provide trimming for said tank circuit.

6. A television tuner comprising: an RF compartment including a mixer circuit; said mixer circuit including a first coupling loop; an oscillator compartment including an ultrahigh frequency oscillator; a plate of conducting material dividing said compartments; said ultrahigh frequency oscillator comprising a transistor having an emitter, a collector, and a base; bias means for the base of said transistor; a second coupling loop connected to the collector of said transistor and inductively coupled to said first coupling loop for conveying the oscillator signals to said mixer circuit; an inductive loop in series with said second coupling loop, said inductive loop controlling the upper limit of the frequency range of said oscillator; a conducting line connected between said inductive loop and ground, said conducting line and said plate forming a resonant transmission line; a shorting bar connected between said conducting line and said plate to vary the effective length of said transmission line to form an adjustable frequency tank circuit; a first metallic tab electrically coupled to the ground end of said conducting line; a second metallic tab electrically coupled to the nongrounded end of said conduction line; said first metallic tab being relatively large in comparison to said second metallic tab, said tabs providing a trimming means for said tank circuit; said plate being inductively coupled to said conducting line to apply a positive feedback signal to the base of said transistor.

7. A television tuner as recited in claim 6 and further including: an inductive coil in series with the emitter of said transistor, said coil providing a positive feedback signal for the emitter circuit of said transistor through the collector-emitter capacitance of said transistor.

8. An ultrahigh frequency oscillator comprising: a transistor having an emitter, collector, and a base, a conducting line connected between the collector of said transistor and ground; a plate of conducting material connected between the base of said transistor and ground, said plate and said conducting line together forming a resonant transmission line, means for varying the effective length of said transmission line to form an adjustable frequency tank circuit; said plate being inductively coupled to said conducting line to supply a positive feedback signal to the base of said transistor and an inductive coil in series with the emitter of said transistor, said coil providing a positive feedback signal for the emitter circuit of said transistor through the collector-emitter capacitance of said transistor.

9. An ultrahigh frequency oscillator comprising: a transistor having an emitter, a collector, and a base; a conducting line connected between the collector of said transistor and ground; a plate of conducting material connected between the base of said transistor and ground, said plate and said conducting line together forming a resonant transmission line; a conductive shorting bar connected between said plate and said conducting line to vary the effective length of said transmission line to form an adjustable frequency tank circuit; said plate being inductively coupled to said conducting line to apply a positive feedback signal to the base of said transistor; and a first metallic tab electrically coupled to the grounded end of said conducting line; a second metallic tab electrically coupled to the nongrounded end of said conducting line, said tabs providing a trimming means for said tank circuit.

10. An ultrahigh frequency oscillator as recited in claim 9 wherein said first metallic tab is relatively large compared to said second metallic tab, whereby said first metallic tab exhibits an inductive effect and said second metallic tab exhibits a capacitive effect, both of these effects being utilized to control the trimming of said tank circuit.

References Cited

UNITED STATES PATENTS

| | | | |
|---|---|---|---|
| 2,788,447 | 4/1957 | Johnson ---------- | 334—72 X |
| 3,154,755 | 10/1964 | Wegener ---------- | 334—45 X |
| 3,289,123 | 11/1966 | Bomhardt et al. ---- | 334—45 X |
| 3,305,784 | 2/1967 | Chalmers et al. ---- | 334—72 X |

OTHER REFERENCES

Specialized Television Engineering, in the Cleveland Institute of Radio Engineers, p. 14.26. May 1954.

KATHLEEN H. CLAFFY, *Primary Examiner.*

R. S. BELL, *Assistant Examiner.*

U.S. Cl. X.R.

331—99; 334—41